United States Patent
Richardson

(10) Patent No.: US 9,306,601 B2
(45) Date of Patent: Apr. 5, 2016

(54) LDPC DESIGN FOR HIGH PARALLELISM, LOW ERROR FLOOR, AND SIMPLE ENCODING

(71) Applicant: QUALCOMM Incorporated, San Diego, CA (US)

(72) Inventor: Thomas Joseph Richardson, South Orange, NJ (US)

(73) Assignee: QUALCOMM Incorporated, San Diego, CA (US)

(*) Notice: Subject to any disclaimer, the term of this patent is extended or adjusted under 35 U.S.C. 154(b) by 58 days.

(21) Appl. No.: 14/179,942

(22) Filed: Feb. 13, 2014

(65) Prior Publication Data

US 2014/0229789 A1      Aug. 14, 2014

Related U.S. Application Data

(60) Provisional application No. 61/764,476, filed on Feb. 13, 2013.

(51) Int. Cl.
*H03M 13/11*    (2006.01)
*H03M 13/03*    (2006.01)
(Continued)

(52) U.S. Cl.
CPC ......... *H03M 13/1105* (2013.01); *H03M 13/036* (2013.01); *H03M 13/116* (2013.01); *H03M 13/118* (2013.01); *H03M 13/1137* (2013.01); *H03M 13/1168* (2013.01);
(Continued)

(58) Field of Classification Search
CPC .......... H03M 13/1105; H03M 13/036; H03M 13/1137; H03M 13/116; H03M 13/1168; H03M 13/118; H03M 13/1185; H03M 13/1188; H03M 13/611; H03M 13/6362
See application file for complete search history.

(56) References Cited

U.S. PATENT DOCUMENTS 7,747,934 B2    6/2010    Livshitz
7,802,164 B2    9/2010    Hong et al.
(Continued)

FOREIGN PATENT DOCUMENTS

EP    1596501 A1    11/2005
WO    WO 2005036758 A1 *    4/2005

OTHER PUBLICATIONS

Divsalar D., et al., "Capacity-Approaching protograph codes", IEEE Journal on Selected Areas in Communications, IEEE Service Center, Piscataway, US, vol. 27, No. 6, Aug. 1, 2009, pp. 876-888, XP011264531, ISSN: 0733-8716.
(Continued)

*Primary Examiner* — April Y Blair
*Assistant Examiner* — Dipakkumar Gandhi
(74) *Attorney, Agent, or Firm* — Mahamedi Paradice LLP

(57) ABSTRACT

A method of data encoding is disclosed. An encoder receives a set of information bits and performs an LDPC encoding operation on the set of information bits to produce a codeword based on a matched lifted LDPC code. The matched lifted LDPC code is based on a commutative lifting group and includes a number of parity bits and a submatrix to determine values of the parity bits. An order of the lifting group (Z) corresponds with a size of the lifting. A determinant of the submatrix is a polynomial of the form: $g_a+(g_0+g_L)P$, where $g_0$ is the identity element of the group, $g_0=g_L^2$, and P is an arbitrary non-zero element of a binary group ring associated to the lifting group.

13 Claims, 11 Drawing Sheets

Variable Nodes 110

Check Nodes 120

(51) Int. Cl.
*H03M 13/00* (2006.01)
*H03M 13/53* (2006.01)

(52) U.S. Cl.
CPC ..... *H03M 13/1185* (2013.01); *H03M 13/1188* (2013.01); *H03M 13/611* (2013.01); *H03M 13/6362* (2013.01)

(56) References Cited

U.S. PATENT DOCUMENTS

| | | | |
|---|---|---|---|
| 8,132,072 B2 | 3/2012 | El-Khamy et al. | |
| 8,429,503 B2 | 4/2013 | Okamura et al. | |
| 2004/0153934 A1* | 8/2004 | Jin et al. | 714/746 |
| 2004/0187129 A1 | 9/2004 | Richardson | |
| 2005/0050435 A1* | 3/2005 | Kyung | H03M 13/1162 714/800 |
| 2005/0283708 A1 | 12/2005 | Kyung et al. | |
| 2006/0031744 A1 | 2/2006 | Blankenship et al. | |
| 2006/0036926 A1* | 2/2006 | Hocevar | 714/758 |
| 2007/0022354 A1* | 1/2007 | Yu et al. | 714/755 |
| 2008/0288846 A1 | 11/2008 | Kyung et al. | |
| 2008/0294963 A1* | 11/2008 | Hwang | H03M 13/036 714/755 |
| 2009/0006906 A1 | 1/2009 | Jacobsen et al. | |
| 2009/0222706 A1* | 9/2009 | Myung | H03M 13/1105 714/752 |
| 2010/0023834 A1 | 1/2010 | Richardson et al. | |
| 2010/0257425 A1* | 10/2010 | Yue et al. | 714/752 |
| 2010/0275093 A1 | 10/2010 | McLaughlin et al. | |
| 2013/0139024 A1 | 5/2013 | Nguyen et al. | |

OTHER PUBLICATIONS

Haley D., et al., "Reversible Low-Density Parity-Check Codes", IEEE Transactions on Information Theory, IEEE Press, USA, vol. 55, No. 5, May 1, 2009, pp. 2016-2036, XP011256118, ISSN: 0018-9448.

International Search Report and Written Opinion—PCT/US2014/016279—ISAEPO—Apr. 24, 2014.

Kou Y., et al., "Low-Density parity-check codes based on finite geometries: A rediscovery and new results", IEEE Transactions on Information Theory, vol. 47, No. 7, Nov. 2001, pp. 2711-2736, XP011028087, ISSN: 0018-9448.

Xu R., et al., "High Girth LDPC coding for OFDMA PHY", IEEE 802.16 Broadband Wireless Access Working Group, No. C802.16E-04/423, Nov. 3, 2004, pp. 1-13, XP002509792.

* cited by examiner $$M(x) = \begin{bmatrix} x & 1 & 0 & 0 & 0 & 0 & 0 & 0 \\ 0 & 1 & 1 & 0 & 0 & 0 & 0 & 0 \\ 0 & 0 & 1 & 1 & 0 & 0 & 0 & 0 \\ 0 & 0 & 0 & 1 & 1 & 0 & 0 & 0 \\ 1 & 0 & 0 & 0 & 1 & 1 & 0 & 0 \\ 0 & 0 & 0 & 0 & 0 & 1 & 1 & 0 \\ 0 & 0 & 0 & 0 & 0 & 0 & 1 & 1 \\ x & 0 & 0 & 0 & 0 & 0 & 0 & 1 \end{bmatrix}$$

FIG. 5

$$M(x) = \begin{bmatrix} x^a & 1 & 0 & 0 & 0 & 0 & 0 & 0 \\ 0 & 1 & 1 & 0 & 0 & 0 & 0 & 0 \\ 0 & 0 & 1 & 1 & 0 & 0 & 0 & 0 \\ 0 & 0 & 0 & 1 & 1 & 0 & 0 & 0 \\ 1 & 0 & 0 & 0 & 1 & 1 & 0 & 0 \\ 0 & 0 & 0 & 0 & 0 & 1 & 1 & 0 \\ 0 & 0 & 0 & 0 & 0 & 0 & 1 & 1 \\ x^b & 0 & 0 & 0 & 0 & 0 & 0 & 1 \end{bmatrix}$$

$$M(x) = \begin{bmatrix} 1 & x^{16} & 0 & x^{13} \\ 1 & x^{241} & x^{235} & x^{58} \\ 0 & x^{241} & x^{122} & 1 \\ 0 & 0 & x^{122} & x^{90} \end{bmatrix}$$

$$M(x) = \begin{bmatrix} 1 & 0 & 0 & x^{45} \\ 1 & x^{241} & 0 & 0 \\ 0 & x^{241} & x^{122} & x^{119} \\ 0 & 0 & x^{122} & 1 \end{bmatrix}$$

$$M(x) = \begin{bmatrix} 1 & 0 & 0 & 0 & 0 & 0 & x^2 & 0 \\ 1 & x^{119} & 0 & 0 & 0 & 0 & 0 & 0 \\ 0 & x^{119} & x^{238} & 0 & 0 & 0 & 0 & x^{261} \\ 0 & 0 & x^{238} & 0 & 0 & 0 & x^{47} & 0 \\ 0 & 0 & 0 & 1 & 0 & 0 & 1 & x^{45} \\ 0 & 0 & 0 & 1 & x^{119} & 0 & 0 & 0 \\ 0 & 0 & 0 & 0 & x^{119} & x^{238} & 0 & 0 \\ 0 & 0 & 0 & 0 & 0 & x^{238} & 0 & 1 \end{bmatrix}$$

LDPC DESIGN FOR HIGH PARALLELISM, LOW ERROR FLOOR, AND SIMPLE ENCODING

RELATED APPLICATIONS

This application claims priority under 35 U.S.C. §119(e) of the commonly-owned U.S. Provisional Patent Application No. 61/764,476, titled "LDPC Design for High Rate, High Parallelism, Low Error Floor, and Simple Encoding," filed Feb. 13, 2013, which is hereby incorporated by reference in its entirety.

TECHNICAL FIELD

The present embodiments relate generally to communications and data storage systems, and specifically to communications and data storage systems that use LDPC codes.

BACKGROUND OF RELATED ART

Many communications systems use error-correcting codes. Specifically, error correcting codes compensate for the intrinsic unreliability of information transfer in these systems by introducing redundancy into the data stream. Low density parity check (LDPC) codes are a particular type of error correcting codes which use an iterative coding system. LDPC codes can be represented by bipartite graphs (often referred to as "Tanner graphs"), wherein a set of variable nodes corresponds to bits of a codeword, and a set of check nodes correspond to a set of parity-check constraints that define the code. A variable node and a check node are considered "neighbors" if they are connected by an edge in the graph. A bit sequence having a one-to-one association with the variable node sequence is a valid codeword if and only if, for each check node, the bits associated with all neighboring variable nodes sum to zero modulo two (i.e., they include an even number of 1's).

For example, FIG. 1A shows a bipartite graph 100 representing an exemplary LDPC code. The bipartite graph 100 includes a set of 5 variable nodes 110 (represented by circles) connected to 4 check nodes 120 (represented by squares). Edges in the graph 100 connect variable nodes 110 to the check nodes 120. FIG. 1B shows a matrix representation 150 of the bipartite graph 100. The matrix representation 150 includes a parity check matrix H and a codeword vector x, where x1-x5 represent bits of the codeword x. More specifically, the codeword vector x represents a valid codeword if and only if Hx=0. FIG. 2 graphically illustrates the effect of making three copies of the graph of FIG. 1A, for example, as described in commonly owned U.S. Pat. No. 7,552,097. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph.

A received LDPC codeword can be decoded to produce a reconstructed version of the original codeword. In the absence of errors, or in the case of correctable errors, decoding can be used to recover the original data unit that was encoded. LDPC decoder(s) generally operate by exchanging messages within the bipartite graph 100, along the edges, and updating these messages by performing computations at the nodes based on the incoming messages. For example, each variable node 110 in the graph 100 may initially be provided with a "soft bit" (e.g., representing the received bit of the codeword) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

Many practical LDPC code designs use quasi-cyclic constructions with large lifting factors and relatively small base graphs to support high parallelism in encoding and decoding operations. Many LDPC codes also use a chain of degree two variable nodes in their construction. Such a degree two variable node chain, sometimes called an accumulate structure, yields simple encoding and good performance. LDPC code designs based on cyclic lifting can be interpreted as codes over the ring of polynomials modulo may be binary polynomials modulo $x^Z-1$, where Z is the lifting size (e.g., the size of the cycle in the quasi-cyclic code). Thus encoding such codes can often be interpreted as an algebraic operation in this ring.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Many LDPC code designs use cyclic lifting to support parallelism. In addition, many LDPC designs used degree two variable node accumulate structures to support simple encoding and because they yield codes with good performance. In coding systems that target very low error rates, however, large accumulate structures can be problematic in that they lead to high error floors. The performance targets for some coding systems are therefore difficult to achieve with cyclic lifted designs that use an accumulate structure. The error floor can be lowered, giving improved performance, by increasing the degree some of the variable nodes in the accumulate chain or generally increasing the degrees of variable nodes in the graph. Doing so, however, generally complicates the encoding process. Thus, it is desirable to find a way to modify accumulate structures that retains the simplicity of encoding while supporting higher degree variable nodes.

LDPC code designs based on cyclic liftings can be interpreted as codes over the ring of polynomials modulo $x^Z-1$, where Z is the lifting size (e.g., the size of the cycle in the quasi-cyclic code). Encoding of such codes often reduces to solving a matrix equation in this ring. The simple encoding of accumulate structures manifests in the simple invertability of the encoding matrix involved in the encoding equation. Additionally, encoding matrices that are nearly upper (or lower) triangular allow many of the parity bits to be determined by back substitution. Initiating the back substitution process involves solving for some initial bits. The difficulty of this initial step is intimately connected to the invertability of the encoding matrix. Commonly used accumulate structures lead to matrices that are nearly dual-diagonal, having non-zero entries largely only on the diagonal and sub-diagonal of the encoding matrix. In some encoding structures that use accumulate chains there is one column in the matrix that is higher degree, typically degree three. In coding systems that target very low error rates, however, large accumulate structures can be problematic in that they lead to high error floors. The error floor can be lowered, giving improved performance, by increasing the degree some of the variable nodes in the accumulate chain or generally increasing the degrees of variable nodes in the graph. Doing so, however, generally complicates the encoding process.

Thus, it is desirable to modify accumulate structures in a manner that retains the simplicity of encoding while supporting higher degree variable nodes. Embodiments herein provide modified encoding structures that yield simple encoding. Some embodiments have structures that may be viewed as modified accumulate chains in which some variable nodes in the chain have additional edges and are therefore of higher degree than two. The encoding matrices for these codes thus have the dual-diagonal structure, but there may be additional non-zero elements above the diagonal. Consequently, there may be additional columns that have degree at least three. By careful selection of the cyclic lifting values, some of the additional edges are chosen so as to render the encoding operation simple while maintaining large girth in the underlying graphical representation of the code, thereby supporting low error floor performance. It will be understood by those familiar with the art that the dual-diagonal and nearly upper triangular structure described is observed explicitly only with appropriate ordering of the columns and rows of the matrix and that the structure exists even with other orderings in which it is not visibly apparent.

BRIEF DESCRIPTION OF THE DRAWINGS

The present embodiments are illustrated by way of example and are not intended to be limited by the figures of the accompanying drawings, where:

FIG. 5 shows the parity bit portion of a lifted parity check matrix representation of an exemplary quasi-cyclic LDPC code;

FIG. 6 shows the parity bit portion of a lifted parity check matrix representation of another exemplary quasi-cyclic LDPC code;

FIG. 7 shows the parity bit portion of a lifted parity check matrix representation of an exemplary LDPC code with rate r=27/30 given in FIG. 10;

FIG. 8 shows the parity bit portion of a lifted parity check matrix representation of an exemplary LDPC code with rate r=13/15 given in FIG. 11;

FIG. 10 shows an exemplary parity check matrix associated with an LDPC code with rate r=27/30;

FIG. 12 shows an exemplary parity check matrix associated with an LDPC code with rate r=21/28.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figures 1A, 1B:
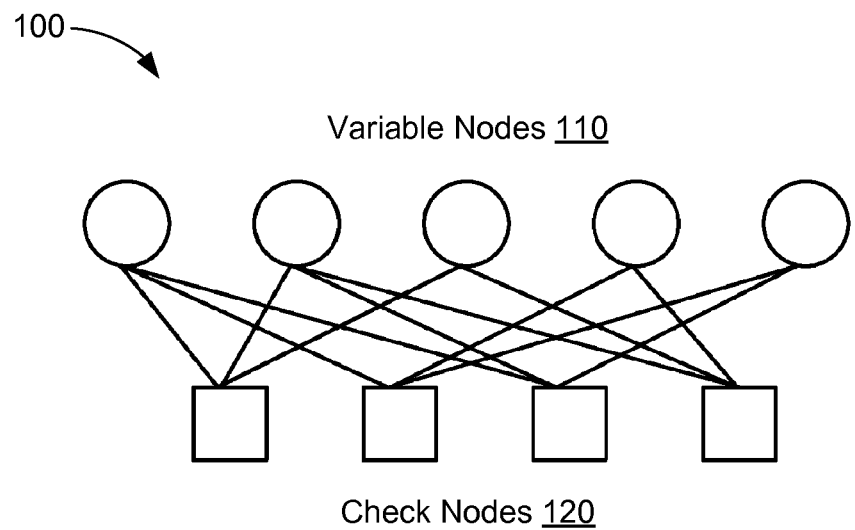
FIGS. 1A-1B show graphical and matrix representations of an exemplary LDPC code.
Figure 2:
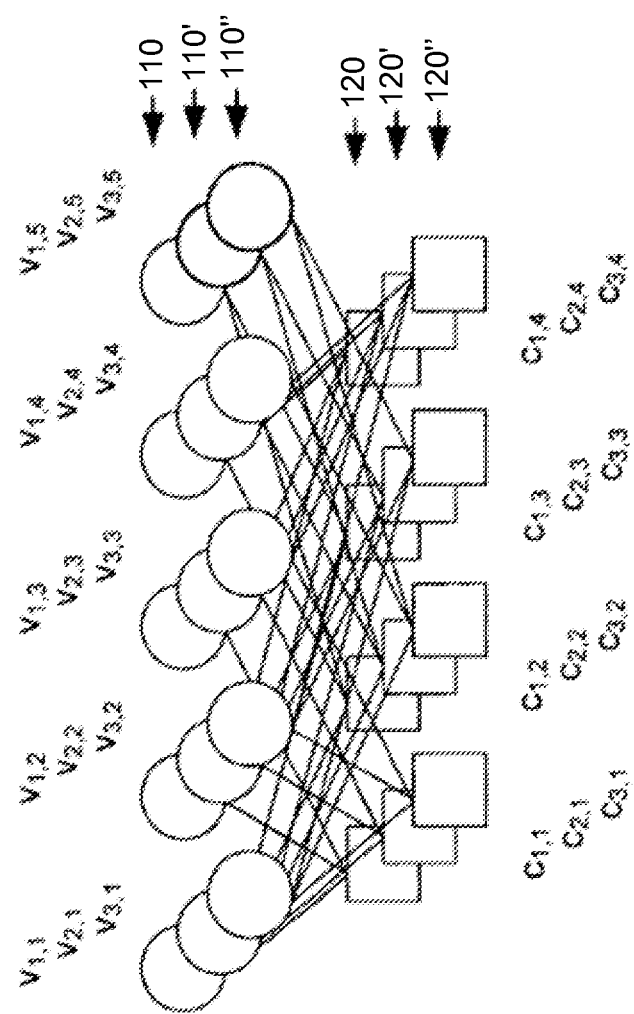
FIG. 2 graphically illustrates the effect of making three copies of the graph of FIG. 1A.
Figure 3:
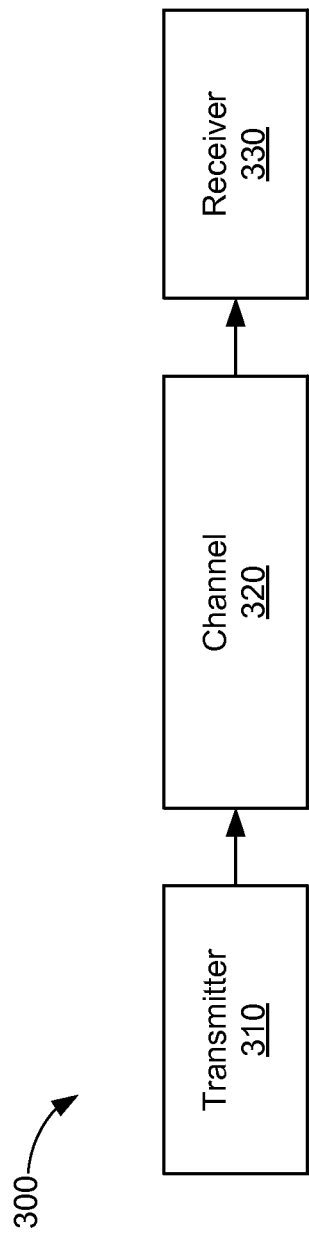
FIG. 3 shows a communications system in accordance with some embodiments.

FIG. 3 shows a communications system 300 in accordance with some embodiments. A transmitter 310 transmits a signal onto a channel 320, and a receiver 330 receives the signal from the channel 320. The transmitter 310 and receiver 330 may be, for example, computers, switches, routers, hubs, gateways, and/or similar devices. In some embodiments, the channel 320 is wireless. In other embodiments, the channel 320 is a wired link (e.g., a coaxial cable or other physical connection).

Imperfections of various components in the communications system 300 may become sources of signal impairment, and thus cause signal degradation. For example, imperfections in the channel 320 may introduce channel distortion, which may include linear distortion, multi-path effects, and/or Additive White Gaussian Noise (AWGN). To combat potential signal degradation, the transmitter 310 and the receiver 330 may include LDPC encoders and decoders. Specifically, the transmitter 310 may perform LDPC encoding on outgoing data to produce a codeword that can be subsequently decoded by the receiver 330 (e.g., through an LDPC decoding operation) to recover the original data. For some embodiments, the transmitter 310 may transmit LDPC-encoded codewords with one or more "punctured" bits, for example, based on an LDPC code with one or more punctured variable nodes.

Lifting is a technique for generating a relatively large LDPC code from multiple copies of a smaller base code. For example, lifting may generate a lifted LDPC code by producing a number (Z) of parallel copies of the updated base graph and then interconnecting the parallel copies through permutations of edge clusters of each copy of the base graph. A cluster of edges refers to the set of Z copies of a single edge in the base graph in the Z parallel copies of the base graph. Lifting enables LDPC codes to be implemented using parallel encoding and/or decoding implementations while also reducing the description complexity typically associated with large LDPC codes. A more detailed discussion of lifted LDPC codes may be found, for example, in the book titled, "Modern Coding Theory," published Mar. 17, 2008, by Tom Richardson and Ruediger Urbanke, which is hereby incorporated by reference in its entirety.

When processing a codeword with lifting size Z, an LDPC decoder may utilize Z processing elements to perform parity check or variable node operations on all Z edges of a lifted graph concurrently. In some embodiments a factor of Z may be used. Specifically, each parity check operation may involve reading a corresponding soft bit value from memory, combining the soft bit value with other soft bit values associated with the check node and writing a soft bit back to memory that results from the check node operation.

Figure 4:
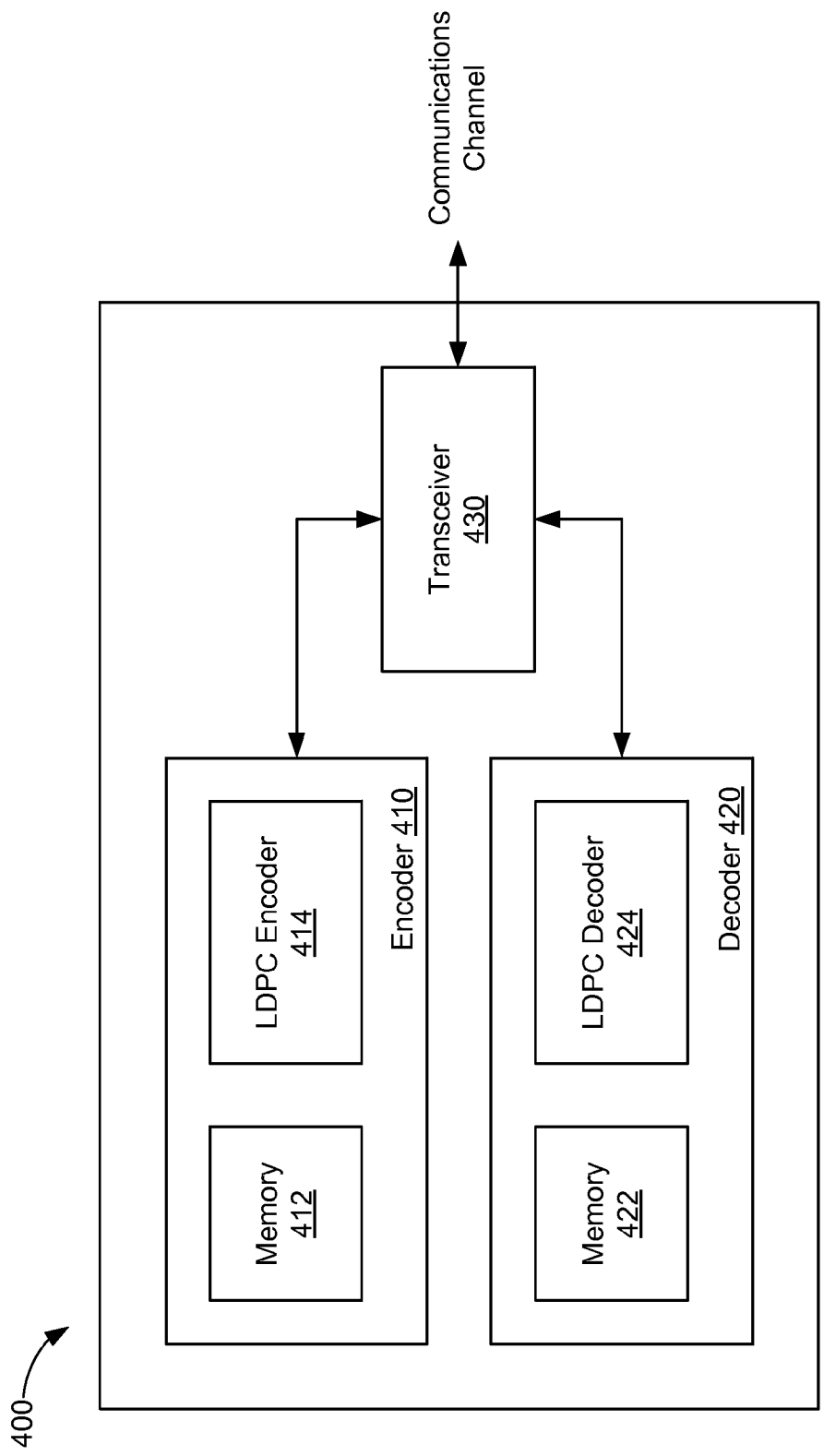
FIG. 4 is a block diagram of a communications device in accordance with some embodiments.

FIG. 4 is a block diagram of a communications device 400 in accordance with some embodiments. The communications device 400 includes an encoder 410, a decoder 420, and a transceiver 430, which transmits and/or receives LDPC-encoded codewords via a communications channel. The encoder 410 includes a memory 412 an LDPC encoder 414. The memory 412 may be used to store data (i.e., information bits) to be encoded by the LDPC encoder 414. The LDPC encoder 414 processes the information bits stored in the memory 412 by generating codewords, based on an LDPC code, to be transmitted to another device. For some embodiments, the LDPC code may be a lifted LDPC code.

The decoder 420 includes a memory 422 and an LDPC decoder 424. The memory 422 stores codewords, received via the transceiver 430, to be decoded by the LDPC decoder 424. The LDPC decoder 424 processes the codewords stored in the memory 424 by iteratively performing parity check operations, using an LDPC code, and attempting correcting any bits that may have been received in error. For some embodiments, the LDPC code may be a lifted LDPC code. For some embodiments, the LDPC decoder 424 may include a plurality of processing elements to perform the parity check or variable node operations in parallel. For example, when processing a codeword with lifting size Z, the LDPC decoder 424 may utilize a number (Z) of processing elements to perform parity check operations on all Z edges of a lifted graph, concurrently. In some embodiments a factor of Z may be used.

For some embodiments, we may consider codes quasi-cyclic binary LDPC codes. For example, we may use a protograph/base-graph perspective and Z to denote the size of the cyclic lifting. Mathematically, cyclically lifted LDPC codes can be viewed as codes over the group algebra of binary polynomials modulo $x^Z-1$. Under this interpretation a binary vector $(b_0, b_1, \ldots, b_{Z-1})$ is interpreted as the polynomial:

$$B(x) = \sum_{i=0}^{n-1} b_i x^i.$$

Then, multiplication by $x^a$ gives:

$$x^a B(x) = \sum_{i=0}^{n-1} b_i x^{((i+a)Z)} = \sum_{i=0}^{n-1} b_{((i-a)Z)} x^i$$

which corresponds with the binary vector obtained by cyclically shifting $(b_0, b_1, \ldots, b_{Z-1})$ to the right by a:

$(b_{Z-a}, b_{Z-a+1}, \ldots, b_{Z-1}, b_0, b_1, \ldots, b_{Z-1-a})$.

In the lifted parity check matrix representation, assuming no multiple edges, the non-null entries of the lifted parity check matrix H may be viewed as integers modulo Z. A codeword $C(x)=[C_1(x), C_2(x), \ldots C_n(x)]^T$ may be viewed as a vector of n binary polynomials modulo $X^Z-1$ (n is the number of variable nodes in the base graph) that satisfies:

$$\sum_{j \in N_i} x^{H_{i,j}} C_j(x) = 0$$

where for each i, where $N_i$ denotes the set of non-null entries in row i of H. For a lifted parity check matrix H we use H(x) to denote the matrix over binary polynomials modulo $X^Z-1$ where $H_{i,j}(x)=x^{H_{i,j}}$ if $H_{i,j}$ is non-null and $H_{i,j}(x)=0$ if $H_{i,j}$ is null. In the case of multiple edges the corresponding entry of H may by taken to be taken to be a set of integers modulo Z. For example, a double edge $H_{ij}=a,b$ may be resolved as $H_{ij}(x)=x^a+x^b$. In subsequent examples we shall assume no multiple edges occur. It will be easily understood by those familiar with the stated algebra how to generalize the description to include multiple edges.

Encoding involves determining C(x) from information bits. A subset of columns in H may be designated as information columns I. If H has dimensions m×n, then there are nm information columns (i.e., |I|=n−m). For some embodiments, I may correspond to the set I={n−m+1, n−m+2, ..., n}. The complements of I in [1,n] are termed the parity columns P. For some embodiments, P may correspond to the set P={1, 2, ..., m}. For some embodiments, the LDPC code includes punctured columns. These columns are not part of the transmitted codeword. At the decoder, the log-likelihood ratios (LLRs) associated with these nodes are initialized to 0. The base transmitted block length is n−p, where p is the number of punctured columns, and the rate is (n−m)/(n−p). The binary information block size is (n−m)*Z, and the transmitted block size is (n−p)*Z.

To perform encoding of such LDPC codes, information bits are used to set $C_i(x)$ for all i∈I. The encoding process solves $C_i(x)$ for i∈P so that H(x)C(x)=0. In some LDPC codes some of the columns in H associated to elements in P may be degree 1. The bits associated to these columns are simple parities of the other bits. Often such bits are parity bits in the code and are easily determined once the other bits are determined. We are generally focused on the encoding of the parity bits that are degree two or more. For convenience of notation we shall assume that there are no such degree 1 variable nodes.

Often the first step of the encoding process is to compute:

$$D_i(x) = \sum_{j \in X \cap N_i} x^{H_{i,j}} C_j(x)$$

where $N_i$ denotes the set of columns with non-null entries in H in row i. Assuming $D(x)=(D_1(x), \ldots, D_m(x))^T$, and temporarily setting $C_i(x)=0$ for i∈P, D(x) can be rewritten as D(x)=H(x)C(x). Let M denote the square submatrix of H formed by taking columns from P. Further, let $C_P(x)$ denote the subvector of C(x) consisting only of parity elements. Then, the encoding process solves the equation:

$$D(x)=M(x)C_P(X)$$

for $C_P(X)$.

It will be observed that the complexity of the encoding process is largely dependent on the complexity of solving this equation. Therefore, the choice of structure of the matrix M has significant importance in determining the encoding complexity. A commonly used encoding structure is a dual diagonal type structure such as the following:

$$M(x) = \begin{bmatrix} 1 & 0 & 0 & 0 & 0 & x \\ 1 & 1 & 0 & 0 & 0 & 0 \\ 0 & 1 & 1 & 0 & 0 & 1 \\ 0 & 0 & 1 & 1 & 0 & 0 \\ 0 & 0 & 0 & 1 & 1 & 0 \\ 0 & 0 & 0 & 0 & 1 & x \end{bmatrix}$$

The dual diagonal structure is apparent in this matrix. The dual diagonal and nearly upper triangular structure implies that a simple Gaussian elimination procedure can be applied. In the above example if each row is replaced by the sum of itself and the rows above then the resulting matrix is upper triangular. The encoding system can then be easily solved.

An encoding approach that generalizes this method is as follows. First, a polynomial vector $p(x)=(p_1(x), \ldots, p_m(x))$ is established to determine:

$$E(x) = p(x)D(x) = \sum_{i=1}^{m} p_i(x)D_i(x)$$

Often, each of the $p_i$ will have low weight. Note that this operation may executed by performing barrel shifts on the vectors $D(x)$ and XORing the results together to obtain $E(x)$. The vector $p(x)$ is chosen so that $p(x)M(x)=(0, \ldots, 0, q(x))$, which yields:

$$E(x)=q(x)C_m(x).$$

In the previous example the corresponding choice of $p(x)$ is the all $-1$ vector. The next step in the encoding process is to compute:

$$C_m(x)=q^{-1}(x)E(x).$$

where $q^{-1}(x)q(x)=1$. For the present embodiments, the parity check matrices are constructed so that $q^{-1}(x)$ has a low complexity realization as a product of low weight polynomials. Finally, a back-substitution step may be performed to determine the remaining $C_j(x)$.

To illustrate notations used herein, an example is provided below that includes a base matrix of size 3×5 and Z=6:

$$H(x) = \begin{bmatrix} 1 & 0 & x^3 & x^1 & x^4 \\ 1 & 1 & x^4 & x^3 & x^2 \\ 0 & 1 & 1 & x^5 & 1 \end{bmatrix}$$

A codeword $C(x)=(C_1(x), \ldots, C_5(x))$, where each $C_i(x)$ is of the form:

$$\sum_{i=0}^{5} b_i x^i$$

corresponding to the binary vector $(b_0, \ldots, b_5)$. In this example, the information columns are $C_4(x)$ and $C_5(x)$. Let these be given as the binary vectors $(1,1,0,1,0,0)$ and $(0,0,0,0,1,1)$, respectively, so that $C_4(x)=1+x+x^3$ and $C_5(x)=x^4+x^5$.

Computing $D(x)$ we have:

$$D(x) = \begin{bmatrix} D_1(x) \\ D_2(x) \\ D_3(x) \end{bmatrix} = \begin{bmatrix} x^1 & x^4 \\ x^3 & x^2 \\ x^5 & 1 \end{bmatrix} \begin{bmatrix} C_4(x) \\ C_5(x) \end{bmatrix} = \begin{bmatrix} x+x^3+x^4 \\ x+x^3+x^4 \\ 1+x^2+x^4 \end{bmatrix}$$

which, in terms of binary vectors is:

$$D \equiv \begin{bmatrix} (0,1,0,1,1,0) \\ (0,1,0,1,1,0) \\ (1,0,1,0,1,0) \end{bmatrix} = \begin{bmatrix} (0,1,1,0,1,0) + (0,0,1,1,0,0) \\ (1,0,0,1,1,0) + (1,1,0,0,0,0) \\ (1,0,1,0,0,1) + (0,0,0,0,1,1) \end{bmatrix}.$$

Now we have:

$$M(x) = \begin{bmatrix} 1 & 0 & x^3 \\ 1 & 1 & x^4 \\ 0 & 1 & 1 \end{bmatrix}$$

and we want to solve (for $C_P(x)=[C_1(x), C_2(x), C_3(x)]^T$):

$$D(x)=M(x)(C_1(x),C_2(x),C_3(x))^T.$$

It will be observed that $M(x)$ has the dual diagonal structure with only the third column being of degree greater than two. Following the Gaussian elimination approach, we left-multiply by $p(x)=(1,1,1)$ and note that:

$$(1,1,1)M(x) = (1,1,1)\begin{bmatrix} 1 & 0 & x^3 \\ 1 & 1 & x^4 \\ 0 & 1 & 1 \end{bmatrix} = (0,0,1+x^3+x^4)$$

so we obtain:

$$D_1(x)+D_2(x)+D_3(x)=(1+x^3+x^4)C_3(x)$$

hence $q(x)=(1+x^3+x^4)$. Now $q(x)^2=q(x^2)=1+x^6+x^8=x^8=x^2$, and so we obtain $q^{-1}(x)=x^4 q(x)$ which leads to $$\begin{aligned} C_3(x) &= x^4(1+x^3+x^4)(D_1(x)+D_2(x)+D_2(x)) \\ &= (x^1+x^2+x^4)(D_1(x)+D_2(x)+D_3(x)) \\ &= (x^1+x^2+x^4)(1+x^2+x^4) \\ &= x^1+x^3+x^5 \end{aligned}$$

which is equivalent to $(0,1,0,1,0,1)$. It will be observed that the polynomial $q(x)$ contains the terms $(1+x^3)$ which when squared gives $(1+x^6)=0$. Present embodiments will choose $M(x)$ so that $q(x)=x^a+(1+x^L)P(x)$ where $2^k L=Z$ for some positive integer k and $P(x)$ is an arbitrary non-zero polynomial. Examples are known then $P(x)$ is monomial. Present embodiments will have $q(x)$ of this general form when $P(x)$ is not simply monomial.

Finally, to complete the encoding of the example, we use back substitution to solve for $C_2(x)$ and $C_1(x)$. We have $C_2(x)=C_3(x)+D_3(x)=1+x+x^2+x^3+x^4+x^5$ and $C_1(x)=x^3 C_3(x)+D_1(x)=1+x+x^2+x^3$. Thus, the resulting codeword is:

$$\begin{bmatrix} (1, 1, 1, 1, 0, 0) \\ (1, 1, 1, 1, 1, 1) \\ (0, 1, 0, 1, 0, 1) \\ (1, 1, 0, 1, 0, 0) \\ (0, 0, 0, 0, 1, 1) \end{bmatrix}.$$

FIG. 5 shows the parity bit portion of a lifted parity check matrix representation 500 of an exemplary quasi-cyclic LDPC code. The matrix representation 500 includes an 8×8 matrix M(x). This is similar to our earlier 6×6 example with row and column order reversed. In this example, therefore the dual diagonal structure appears as a diagonal and supper diagonal and the matrix is nearly lower triangular rather than upper triangular. The leftmost column has degree three in this case. Encoding may be performed by first summing the rows of M(x) to obtain:

[1 0 0 0 0 0 0 0]

It can be determined that:

$$C_1(x) = \sum_{i=1}^{m} D_i(x)$$

The remaining $C_i(x)$ may be easily obtained by back substitution. In this example we can observe the accumulate chain in the dual-diagonal structure in the second to the eighth column. Summing over the accumulate chain leads to this particularly simple example.

In this example, the matrix M(x) also shows that the corresponding bipartite graph contains Z loops, each including m−1 degree 2 variable nodes and a single degree 3 variable node. If m is small, then this structure could lead to poor performance, slow convergence, and a high error floor.

FIG. 6 shows the parity bit portion of a lifted parity check matrix representation 600 of another exemplary quasi-cyclic LDPC code. The matrix representation 600 includes an 8×8 matrix M(x), where 0, a, and b are all distinct modulo Z. In this case summing the rows of M(x) produces:

[$1+x^a+x^b$ 0 0 0 0 0 0 0]

Thus, based on equation [1], it can be determined that:

$$(1+x^a+x^b)C_1(x) = \sum_{i=1}^{m} D_i(x)$$

To solve for $C_1(x)$, $(1+x_a+x^b)$ must first be inverted. For low complexity, it may be preferable that the inverse has low weight. Thus, a and b may be chosen accordingly to facilitate this. More specifically, there are two observations that may help in choosing a and b. The first is the general relation:

$$\left(\sum_{i=1}^{k} x^{a_i}\right)^2 = \sum_{i=1}^{k} x^{2a_i}$$

The second is that if a and b both divide Z (e.g., assume d>1 is the greatest common divisor), then the problem is equivalent to inverting $(1+x^{a/d}+x^{b/d})$ in the ring of binary polynomials modulo $x^{Z/d}-1$. Note, however, that if this happens then the matrix M represents d disjoint subgraphs.

Now, assume $Z=2^k L$. This yields the equation: $(1+x^L)^{2^k}=0$, or more generally $(1+x^{2^l L})^{2^{k-l}}=0$, for $l \in \{1, 2, \ldots, k\}$. Thus, if $a=2^l L$ or $b=2^l L$, or $a-b=2^l L$, then $(1+x^a+x^b)$ can be easily inverted. For example, if k=3 and a=L, then the equation becomes:

$(1+x^{4a}+x^{4b})(1+x^{2a}+x^{2b})(1+x^a+x^b)(1+x^a+x^b)=x^{8b}$

From here, we see that the inverse of $(1+x^a+x^b)$ may be obtained using a simple procedure that involves multiplying by the first three factors on the right and then cyclically shifting the result.

Accordingly, the main difficulty of the encoding operation may be reduced to inverting the determinant of M(x). In general, a binary polynomial is invertible only if its weight is an odd number. This limits the possible structures of M(x). Note that the above procedure can be used to invert any polynomial of the form:

$$q(x)=x^a+(1+x^L)P(x) \qquad [2]$$

where P(x) is an arbitrary non-zero polynomial, a is arbitrary, and $2^k L=0$ modulo Z for some positive integer k. Then $q(x^{2^k})=x^{2^k a}$. Since $q(x^{2^k})=q(x^{2^{k-1}})q(x^{2^{k-2}})\ldots q(x)^2$ we obtain the inverse of q(x) as $x^{-2^k a}q(x^{2^{k-1}})q(x^{2^{k-2}})\ldots q(x)$. For matrices that have dual-diagonal nearly upper or lower triangular form, the q(x) obtained by the above operation is, up to a monomial factor, the determinant of M(x). Thus, for some embodiments, the matrix M(x) may be constructed such that det M(x) takes the form of equation [2].

Figure 10:
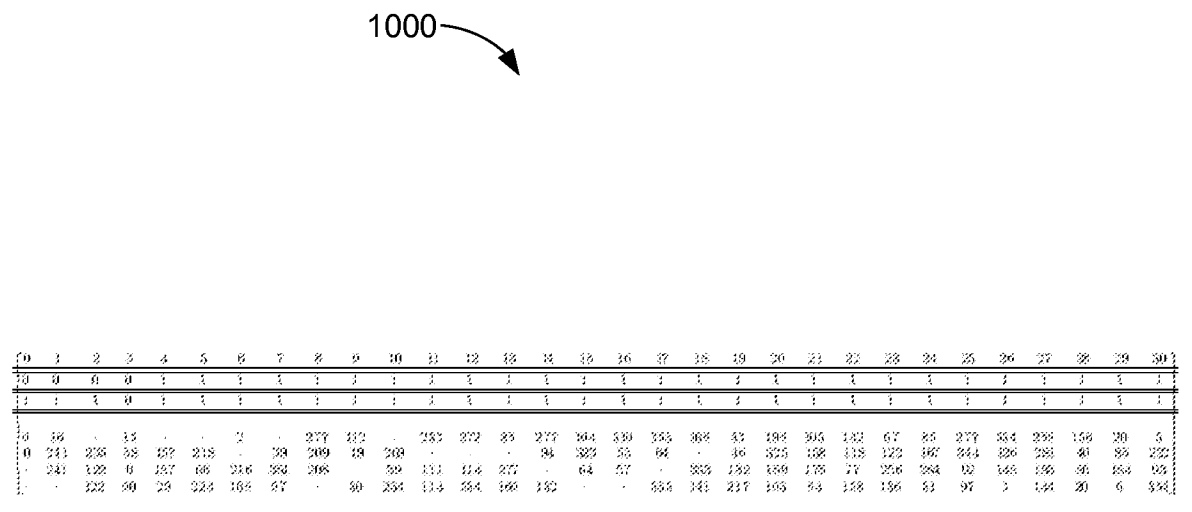

FIG. 7 shows the parity bit portion of a lifted parity check matrix representation 700 of an exemplary LDPC code with rate r=27/30 given in FIG. 10. An encoding operation may be performed by first setting $p(x)=(1,1,(1+x^{135}),(1+x^{113}+x^{135}))$ to produce:

$E(x)=D_1(x)+D_2(x)+(1+x^{135})D_3(x)+(1+x^{113}+x^{135})D_4(x)$

It may then be verified that $q(x)=(1+x^{13}+x^{58}+x^{90}+x^{135}+x^{203}+x^{225})$, thus:

$E(x)=(1+x^{13}+x^{58}+x^{90}+x^{135}+x^{203}+x^{225})C_4(x)$

We have $q(x)=x^{203}+(1+x^{45})(x^{13}+(1+x^{45})(1+x^{135}))=x^{203}+(1+x^{45})P(x)$, where $P(x)=x^{13}+(1+x^{45})(1+x^{135})=1+x^{13}+x^{45}+x^{135}+x^{180}$ so we can solve for $C_4(x)$ as:

$C_4(x)=(x^{228}+x^{268}+x^{48})(1+x^{26}+x^{118}+x^{180}+x^{278}+x^{36}+x^{90})(1+x^{13}+x^{58}+x^{90}+x^{135}+x^{203}+x^{225})E(x)$

Note that some simplification occurred in this example, and in fact the middle factor in the above product can be further simplified, because of the form of some of the additional terms occurring inside P(x). Finally, solving by back substitution, to complete the encoding we get:

$C_3(x)=x^{326}C_4(x)+x^{288}D_4(x)$ $C_2(x)=x^{241}C_3(x)+x^{119}D_3(x)+x^{119}D_4(x)$ $C_1(x)=x^{16}C_2(x)+x^{13}C_4(x)+D_1(x)$

Figure 11:
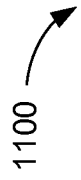
FIG. 11 shows an exemplary parity check matrix associated with an LDPC code with rate r=13/15.

FIG. 8 shows the parity bit portion of a lifted parity check matrix representation 800 of an exemplary LDPC code with rate r=13/15 given in FIG. 11. An encoding operation may be performed by first setting p(x)=(1,1,1,1) to produce:

$E(x)=D_1(x)+D_2(x)+D_3(x)+D_4(x)$

It may then be verified that $q(x)=(1+x^{45}+x^{119})$, thus:

$E(x)=(1+x^{45}+x^{119})C_4(x)$

Solving for $C_4(x)$ yields:

$C_4(x)=x^{128}(1+x^{180}+x^{116})(1+x^{90}+x^{238})(1+x^{45}+x^{119})E(x)$

Finally, $C_1(x), \ldots, C_3(x)$ may be obtained by back substitution.

Figure 9:
FIG. 9 shows the parity bit portion of a lifted parity check matrix representation of an exemplary LDPC code with rate r=21/28 given in FIG. 12.
Figure 12:
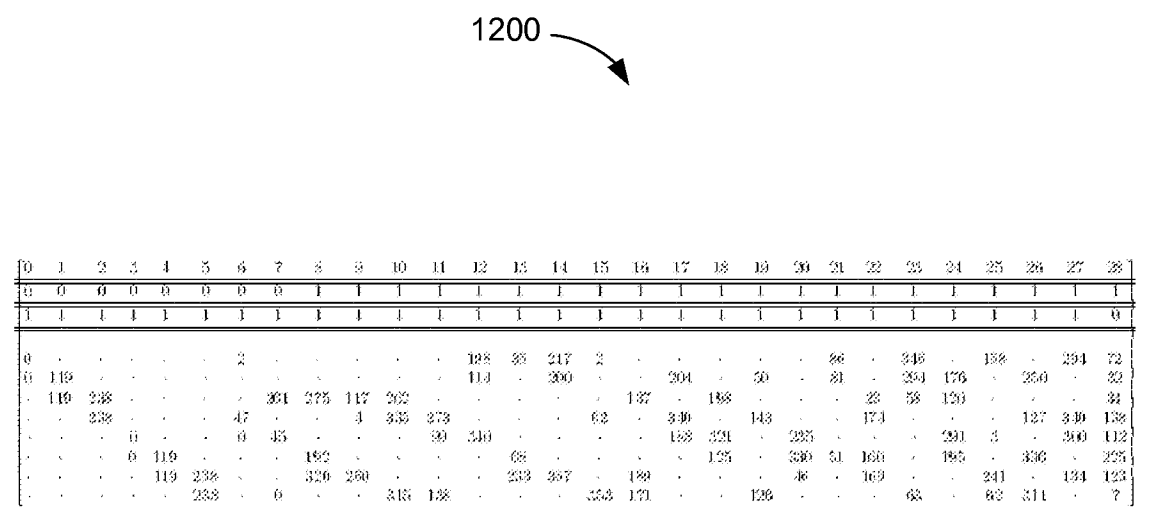

FIG. 9 shows the parity bit portion of a lifted parity check matrix representation 900 of an exemplary LDPC code with rate r=21/28 given in FIG. 12. An encoding operation may be performed by first setting $p(x)=(1,1,1,1,x^2+x^{47},x^2+x^{47},x^2+x^{47},x^2+X^{47})$ to produce:

$$E(x)=D_1(x)+D_2(x)+D_3(x)+D_4(x)+(x^2x^{47})(D_5(x)+D_6(x)+D_7(x)+D_8(x))$$

It may then be verified that $q(x)=(x^2+x^{92}+x^{261})$, thus:

$$E(x)=(x^2+x^{92}+x^{261})C_8(x)$$

Solving for $C_8(x)$ yields:

$$C_8(x)=(x^{42}+x^{222}+x^{200})(1+x^{90}+x^{259})E(x)$$

Finally, $C_1(x), \ldots, C_7(x)$ may be obtained by back substitution.

In all examples presented we have assumed a cyclic lifting. The concepts presented can be generalized to the class of matched liftings. A general matched lifting uses a lifting of a group whose order is the same as the size of the lifting. In the case of cyclic liftings the group is the cyclic group. Other examples of matched liftings can use products of cyclic groups or arbitrary finite groups. In this generalized setting, the group G consists of Z elements $g_0, g_1, \ldots, g_{Z-1}$ and a multiplication rule $g_i g_j = g_k$ satisfying the well-known definition of a group. Every group has an identity element, which we take to be $g_0$. A matched lifted binary LDPC code over G can be interpreted as a code over the group ring consisting of elements of the form $$\sum_{i=0}^{Z-1} b_i g_i.$$

Addition in the ring corresponds to addition of corresponding coefficients as $$\sum_{i=0}^{Z-1} b_i g_i + \sum_{i=0}^{Z-1} c_i g_i = \sum_{i=0}^{Z-1} (b_i + c_i) g_i.$$

Multiplication is based on the group multiplication as $$\left(\sum_{i=0}^{Z-1} b_i g_i\right)\left(\sum_{i=0}^{Z-1} c_i g_i\right) = \sum_{i=0}^{Z-1} d_i g_i$$

where $$d_i = \sum_{j,k: g_j g_k = g_i} b_j c_k.$$

In the case of a cyclic lifting we can simply identify $g_i$ with $x^i$ and multiplication in the group ring is polynomial multiplication modulo $x^Z-1$. If the group G is commutative, which means $g_i g_j = g_j g_i$ for all i,j, then the identity $q(x^2)=q(x)^2$ holds generally in the generalized group ring. More specifically it holds that $$\left(\sum_{i=0}^{Z-1} b_i g_i\right)^2 = \sum_{i=0}^{Z-1} b_i (g_i)^2.$$

Therefore, the above described constructions for simple encoding generalize to the case of arbitrary commutative matched liftings. The simplifying condition is that the determinant of the encoding matrix M take the form $g_a+(g_0+g_L)P$ where P is an arbitrary element of the group ring and has the property $g_L^{2^k}=g_0$ for some positive integer k.

In the above examples, the encoding submatrix was, up to permutation or rows and/or columns, nearly upper (or lower) triangular. In other words, all elements below the subdiagonal in M are 0. Such a construction involves at least one variable node being degree two in M. In some applications requiring very deep error floor, it may be desirable that the minimum degree be larger than two. In this case inverting M is generally more involved than the examples presented above. It will be observed, however, that the main encoding problem is related to inverting M and that this may be made simple by ensuring that the determinant of M has the desired form namely $x^a+(1+x^L)P(x)$ in the case of quasi-cyclic liftings and the form $g_a+(g_0+g_L)P$ in the case of arbitrary commutative group matched liftings.

In the present embodiments, codewords of the lifted LDPC codes may be viewed as a two dimensional binary array of size Z×n, where n is the base (transmission) block length. For some embodiments, the proposed codes are defined such that Z=360. In each constellation, k bits may be taken at a time, per dimension (e.g., for 1024QAM, k=5). Furthermore, k is a factor of 360, and k bits may be taken at a time columnwise, thus generating 360/k dimensions or 180/k symbols per column. It should thus be noted that k is a factor of 60 for the set k∈{1,2,3,4,5,6}, in the cases of interest.

FIGS. 10, 11, and 12 show exemplary parity check matrices 1000, 1100, and 1200, respectively, in accordance with some embodiments. In each of the parity check matrices 1000, 1100, and 1200, the top row indexes columns of H. The second row indicates information (1) and parity (0) columns. The third row indicates transmitted columns (1) and punctured columns (0).

Note that the parity check matrices 1000 and 1100, which are associated with LDPC codes with rates r=27/30 and r=13/15, respectively, are systematic. However, the parity check matrix 1200, which is associated with an LDPC code with rate r=21/28, has a punctured information column, and is therefore not fully systematic.

Figure 13:
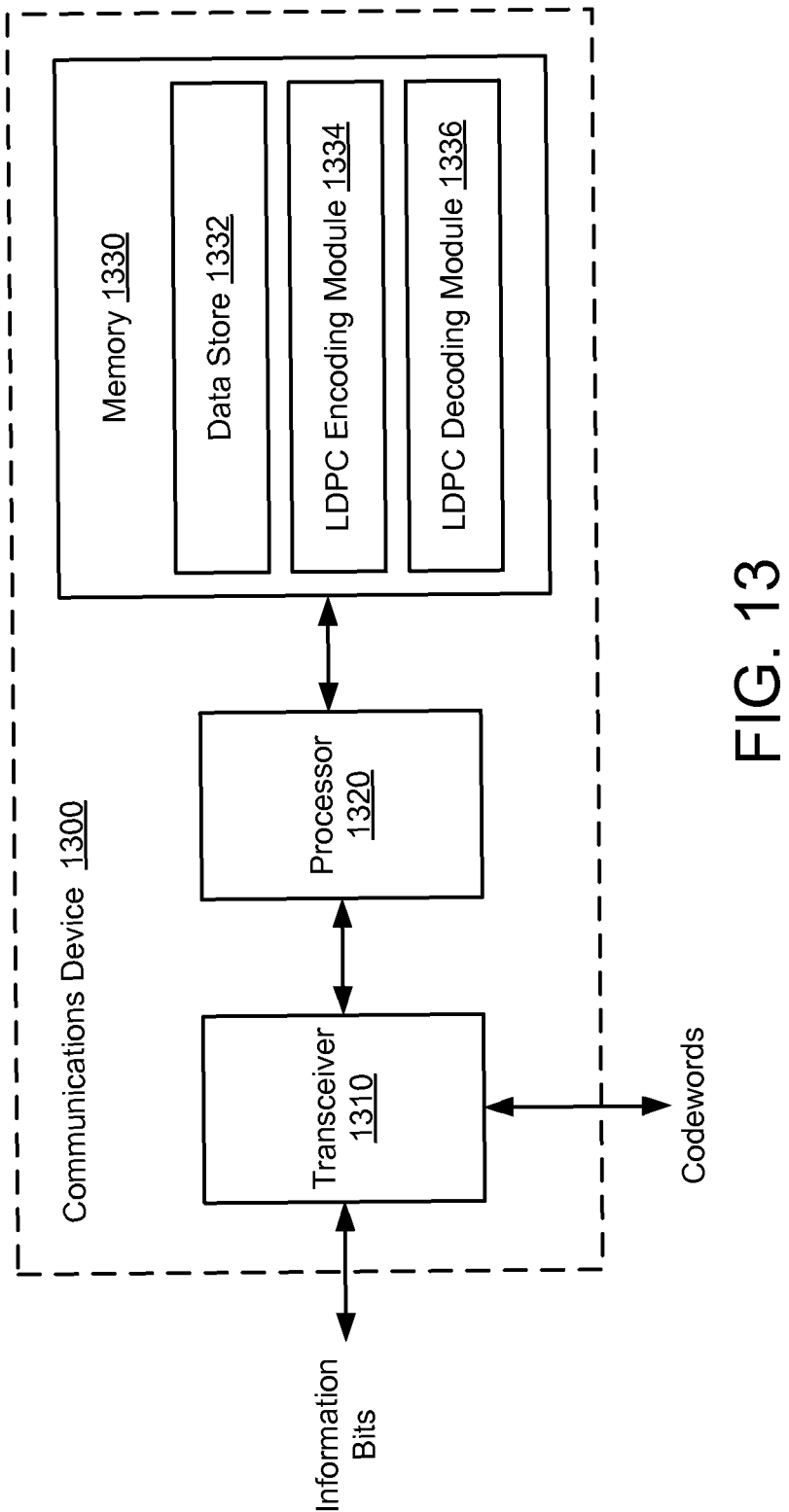
FIG. 13 is a block diagram of a communications device in accordance with some embodiments.

FIG. 13 is a block diagram of a communications device 1300 in accordance with some embodiments. The communications device 1300 includes a transceiver 1310, a processor 1320, and memory 1330. The transceiver 1310 may be used for communicating data to and/or from the communications device 1300. For example, the transceiver 1310 may receive and/or transmit information bits between the communications device 1300 and a CPU. The encoder interface 1310 may also output and/or receive LDPC codewords between the communications device 1300 and another communications device in a network.

Memory 1330 may include a data store 1332 that may be used as a local cache to store the received information bits and/or codewords. Furthermore, memory 1330 may also include a non-transitory computer-readable storage medium (e.g., one or more nonvolatile memory elements, such as EPROM, EEPROM, Flash memory, a hard drive, etc.) that can store the following software modules:

an LDPC encoding module 1334 to encode a set of information bits, using an LDPC code, to produce a codeword; and an LDPC decoding module 1336 to decode LDPC codewords using an LDPC code.

Each software module may include instructions that, when executed by the processor 1320, may cause the encoder 1300 to perform the corresponding function. Thus, the non-transitory computer-readable storage medium of memory 1330 may include instructions for performing LDPC encoding operations (e.g., as described above with respect to FIGS. 5-12). It should be noted that, while the modules 1334-1336 are depicted as software in memory 1330, any of the module may be implemented in hardware, software, firmware, or a combination of the foregoing.

The processor 1520, which is coupled between the encoder interface 1510 and the memory 1530, may be any suitable processor capable of executing scripts of instructions of one or more software programs stored in the decoder 1500 (e.g., within memory 1530). For example, the processor 1520 may execute the LDPC encoding module 1534, the CW puncturing module 1536, and/or the LDPC decoding module 1538.

The processor 1320, which is coupled between the encoder interface 1310 and the memory 1330, may be any suitable processor capable of executing scripts of instructions of one or more software programs stored in the decoder 1300 (e.g., within memory 1330). For example, the processor 1320 may execute the LDPC encoding module 1334 and/or the LDPC decoding module 1336.

The LDPC encoding module 1334 may be executed by the processor 1320 to encode the information bits, using the LDPC code, to produce a codeword. For example, the processor 1320, in executing the LDPC encoding module 1334, may perform an LDPC encoding operation on the information bits based on an LDPC code that is shared by the LDPC encoding module 1334 and a decoding module of a corresponding receive device. Each codeword may include the original information bits as well as a set of parity bits which may be used to perform parity checks on and/or recover the original information bits.

For some embodiments, the LDPC code may be a lifted LDPC code based on a quasi-cyclic lifting to reduce and/or minimize encoding complexity (e.g., as described above with respect to FIGS. 5-12). For example, the LDPC code may include a number of parity bits and a submatrix to determine values of the parity bits. Specifically, the LDPC code may be a matched lifted LDPC code of order Z (i.e., corresponding to the size of the lifting). A determinant of the submatrix may be a polynomial of the form: $g_a+(g_0+g_L)P$, where $g_0$ is the identity element of the group, $g_0=g_L^{2^k}$, and P is an arbitrary non-zero element of a binary group ring associated to the lifting group. For some embodiments, the lifting group may be a cyclic group, where $g_i$ may be identified with $x^i$. Accordingly, the determinant of the submatrix may be of the: $x^a+(1+x^L)P(x)$, wherein $P(x)$ has at least two terms and $2^k L=0$ modulo Z.

The LDPC decoding module 1336 may be executed by the processor 1320 to decode LDPC codewords using the LDPC code. As described above, the LDPC code may be a lifted LDPC code (e.g., based on a quasi-cyclic lifting).

In the foregoing specification, the present embodiments have been described with reference to specific exemplary embodiments thereof. It will, however, be evident that various modifications and changes may be made thereto without departing from the broader scope of the disclosure as set forth in the appended claims.

What is claimed is:

1. A method of data encoding, the method comprising:
receiving a set of information bits;
performing a low density parity check (LDPC) encoding operation on the set of information bits to produce a codeword based on a matched lifted LDPC code, wherein the matched lifting is based on a commutative lifting group and wherein the LDPC code includes a number of parity bits and a submatrix to determine values of the parity bits, and wherein:
an order of the lifting group (Z) corresponds with a size of the lifting;
a determinant of the submatrix is a polynomial of the form: $g_a+(g_0+g_L)P$, wherein:
$g_0$ is the identity element of the group,
$g_0=g_L^{2^k}$,
$Z=2^k*L$, for a positive integers k and L,
$a=2^i*L$, for a non-negative l<k, and
P is an arbitrary non-zero element of a binary group ring associated to the lifting group.

2. The method of claim 1 wherein the lifting group is a cyclic group, wherein:
$g_i$ may be identified with $x^i$; and
the determinant of the submatrix is of the form: $x^a+(1+x^L)P(x)$, wherein $P(x)$ has at least two terms and $2^k L=0$ modulo Z.

3. The method of claim 1 in which the submatrix is, up to permutations of its rows and columns, upper triangular.

4. The method of claim 3, wherein elements below the first subdiagonal of the submatrix are equal to 0.

5. A non-transitory computer-readable storage medium containing program instructions that, when executed by a processor provided within a communications device, causes the device to:
receive a set of information bits;
perform an LDPC encoding operation on the set of information bits to produce a codeword based on a matched lifted LDPC code, wherein the matched lifting is based on a commutative lifting group and wherein the LDPC code includes a number of parity bits and a submatrix to determine values of the parity bits, and wherein:
an order of the lifting group (Z) corresponds with a size of the lifting;
a determinant of the submatrix is a polynomial of the form: $g_a+(g_0+g_L)P$, wherein:
$g_0$ is the identity element of the group,
$g_0=g_L^{2^k}$,
$z=2^k*L$, for a positive integers k and L,
$a=2^i*L$, for a non-negative l<k, and
P is an arbitrary non-zero element of a binary group ring associated to the lifting group.

6. The non-transitory computer-readable medium of claim 5 wherein the lifting group is a cyclic group, wherein:
$g_i$ may be identified with $x^i$; and
the determinant of the submatrix is of the form: $x^a+(1+x^L)P(x)$, wherein $P(x)$ has at least two terms and $2^k L=0$ modulo Z.

7. The non-transitory computer-readable medium of claim 5 in which the submatrix is, up to permutations of its rows and columns, upper triangular.

8. The non-transitory computer-readable medium of claim 7, wherein elements below the first subdiagonal of the submatrix are equal to 0.

9. A communications device, comprising:
a memory to store a set of information bits; and
an encoder to:
perform an LDPC encoding operation on the set of information bits to produce a codeword based on a matched lifted LDPC code, wherein the matched lifting is based on a commutative lifting group and wherein the LDPC code includes a number of parity bits and a submatrix to determine values of the parity bits, and wherein:
an order of the lifting group (Z) corresponds with a size of the lifting;
a determinant of the submatrix is a polynomial of the form: $g_a+(g_0+g_L)P$, wherein:
$g_0$ is the identity element of the group,
$g_0=g_L^{2^k}$,
$z=2^k*L$, for a positive integers k and L,
$a=2^l*L$, for a non-negative l<k, and
P is an arbitrary non-zero element of a binary group ring associated to the lifting group.

10. The device of claim 9 wherein the lifting group is a cyclic group, wherein:
$g_i$ may be identified with $x^i$; and
the determinant of the submatrix is of the form: $x^a+(1+X^L)P(x)$, wherein P(x) has at least two terms and $2^k L=0$ modulo Z.

11. The device of claim 9 in which the submatrix is, up to permutations of its rows and columns, upper triangular.

12. The device of claim 11, wherein elements below the first subdiagonal of the submatrix are equal to 0.

13. An encoder, comprising:
means for receiving a set of information bits;
means for performing an LDPC encoding operation on the set of information bits to produce a codeword based on a matched lifted LDPC code, wherein the matched lifting is based on a commutative lifting group and wherein the LDPC code includes a number of parity bits and a submatrix to determine values of the parity bits, and wherein:
an order of the lifting group (Z) corresponds with a size of the lifting;
a determinant of the submatrix is a polynomial of the form: $g_a+(g_0+g_L)P$, wherein:
$g_0$ is the identity element of the group,
$g_0=g_L^{2^k}$,
$Z=2^k*L$, for a positive integers k and L,
$a=2^l*L$, for a non-negative l<k, and
P is an arbitrary non-zero element of a binary group ring associated to the lifting group.

* * * * *